United States Patent [19]

Vranish et al.

[11] Patent Number: 5,214,388

[45] Date of Patent: May 25, 1993

[54] PHASE DISCRIMINATING CAPACITIVE ARRAY SENSOR SYSTEM

[75] Inventors: John M. Vranish, Crofton; Wadi Rahim, Severna Park, both of Md.

[73] Assignee: The United States of America as represented by the Administrator of the National Aeronautics and Space Administration, Washington, D.C.

[21] Appl. No.: 889,577

[22] Filed: May 28, 1992

[51] Int. Cl.$^5$ .............................. G01R 27/26
[52] U.S. Cl. ............................ 324/683; 324/662; 324/681; 324/690; 340/870.37
[58] Field of Search ............... 324/660, 662, 681, 683, 324/687, 690; 340/870.37

[56] References Cited

U.S. PATENT DOCUMENTS

| | | | |
|---|---|---|---|
| 4,190,797 | 2/1980 | Lecklida et al. | 324/662 |
| 4,888,824 | 12/1989 | Andersen | 324/690 |
| 4,908,574 | 3/1990 | Rhoades et al. | 324/690 |
| 4,918,376 | 4/1990 | Poduje et al. | 324/690 |
| 4,958,129 | 9/1990 | Poduje et al. | 324/690 X |
| 5,049,824 | 9/1991 | Suzuki | 340/870.37 |
| 5,097,216 | 3/1992 | Pimmick, Sr. et al. | 324/690 |
| 5,166,679 | 11/1992 | Vranish et al. | 324/687 X |
| 5,184,082 | 2/1993 | Nelson | 324/681 X |

Primary Examiner—Kenneth A. Wieder
Assistant Examiner—Glenn W. Brown
Attorney, Agent, or Firm—Paul S. Clohan, Jr.; R. Dennis Marchant; Guy M. Miller

[57] ABSTRACT

A phase discriminating capacitive sensor array system which provides multiple sensor elements which are maintained at a phase and amplitude based on a frequency reference provided by a single frequency stabilized oscillator. Sensor signals provided by the multiple sensor elements are controlled by multiple phase control units, which correspond to the multiple sensor elements, to adjust the sensor signals from the multiple sensor elements based on the frequency reference. The adjustment made to the sensor signals is indicated by output signals which indicate the proximity of the object. The output signals may also indicate the closing speed of the object based on the rate of change of the adjustment made, and the edges of the object based on a sudden decrease in the adjustment made.

13 Claims, 3 Drawing Sheets

PHASE DISCRIMINATING CAPACITIVE ARRAY SENSOR SYSTEM

ORIGIN OF THE INVENTION

The invention described herein was made in the performance of work under a NASA contract and by an employee of the U.S. Government and is subject to Public Law 96-517 (35 U.S.C. §200 et. seq.). The contractor has not elected to retain title to the invention.

BACKGROUND OF THE INVENTION

1. Field of the Invention

The present invention relates generally to capacitive sensor arrays, and more particularly to a phase discriminating capacitive sensor array system having a capacitive sensor array producing sensor signals which are phase and amplitude controlled based on a frequency reference provided by a single frequency stabilized oscillator.

2. Description of the Related Art

Capacitive sensor arrays are used in industry to sense the proximity of an object. Conventionally, capacitive sensor arrays have been provided with a circuit having a number of free running oscillators, each corresponding to one of a number of sensor elements in the array provided to sense the object. When one of the sensors detected the object (was "pulled") the corresponding oscillator experienced a change in frequency. The conventional circuit recognized the object based on a change in capacitance caused by the change in the frequency of the free running oscillator. An example of such a conventional capacitive sensor array system is fully described in An In-situ Evaluation of a Caoacitive Sensor Based Safety System for Automotive Manufacturing Environment, by Don L. Millard, published in Robots 13, Conference Proceedings, SME/RI, May 7-11, 1989.

In the conventional capacitive sensor array system described above, however, because each of the free running oscillators provided for each sensor element is susceptible to being "pulled" as described above, the sensors have had to be placed far enough apart to ensure that the free running oscillators in each senor did not interact, couple and lock on to each other (cross talk). As a result, the range and sensitivity of the conventional capacitive sensor array system has been limited by a significant degree. Also, pixelized imaging has not been possible due to the lack of proximal collocation of the sensor elements.

Another disadvantage of the conventional capacitive sensor array system has been that the multiple free running oscillators have required that relatively wide band widths be provided for the sensor electronics input bandwidths. These wide bandwidths have resulted in increased noise and a decreased signal-to-noise ratio. As a result of this disadvantage as well, the range and sensitivity of the conventional capacitive sensor array system have been limited by a significant degree.

Still another disadvantage of the conventional capacitive sensor array system has been that frequency drift could not be prevented. Since the conventional capacitive sensor array system depended on "pulling" the oscillator, frequency stabilized oscillators, such as common crystal controlled oscillators, could not be provided. As a result, frequency drift has posed a major problem in the past, particularly due to increases in heat and temperature.

An additional disadvantage potentially present in a conventional capacitive sensor array system is that "capaciflector" sensors could not be easily employed. In a capaciflector sensor system, individual shields are employed for each sensor element. As a result, a capaciflector system using multiple free running oscillators must have sufficient spacing to prevent cross talk with the shields.

SUMMARY OF THE INVENTION

It is a object of the invention to provide a capacitive sensor array system without limitation on the proximity of adjacent sensor elements.

Another object of the invention is to provide a capaciflector system without limitation on the proximity of sensor elements with the capaciflector shields.

Still another object of the invention is to provide a capacitive sensor array system without cross talk between the sensor elements.

Yet another object of the invention is to provide a capacitive sensor array system with a pixelized imaging capability.

Another object of the invention is to provide a capacitive sensor array system with narrow band filtering and resulting minimal noise and high signal to noise ratio.

Still another object of the invention is to provide a capacitive sensor array system without frequency drift.

Yet another object of the invention is to provide a capacitive sensor array system which can detect the proximity, closing speed and edges of an object sensed by the sensor elements.

The above and other objects can be obtained by a phase discriminating capacitive sensor array system as will be described. The system provides a single free running oscillator which is stabilized to a fixed frequency. Multiple sensor elements are provided for which the single oscillator is a frequency reference. Multiple phase control units, corresponding to the multiple sensor elements, are also provided which control the phase and amplitude of the sensor signals from the sensor elements to stay identical to that of the frequency reference, and which determine the proximity of an object by measuring the adjustment made to the sensor signals. The phase control units may also determine the closing speed of the object based on the rate of change of the adjustment, and the edges of the object based on a sudden reduction in the adjustment made.

BRIEF DESCRIPTION OF THE DRAWINGS

The accompanying drawings illustrate the present invention, and together with the description serve to explain the principles of the invention. In the drawings.

DETAILED DESCRIPTION OF THE PREFERRED EMBODIMENTS

As discussed above, the present invention is directed to a phase discriminating capacitive sensor system which provides a single free running oscillator which is stabilized to a fixed frequency, multiple sensor elements for which the single oscillator is a frequency reference, and multiple phase control units, corresponding to the multiple sensor elements, which control the phase and amplitude of the sensor signals from the sensor elements to stay identical to that of the frequency reference.

Each phase control unit determines the proximity of an object by measuring any change in capacitance of a corresponding sensor element which senses an object, based on the adjustment made to the sensor signal from the corresponding sensor element. Each phase control unit also determines the closing speed of an object detected by the corresponding sensor element, by measuring the rate of change of the adjustment made to the sensor signal from the corresponding sensor element.

Figure 1:
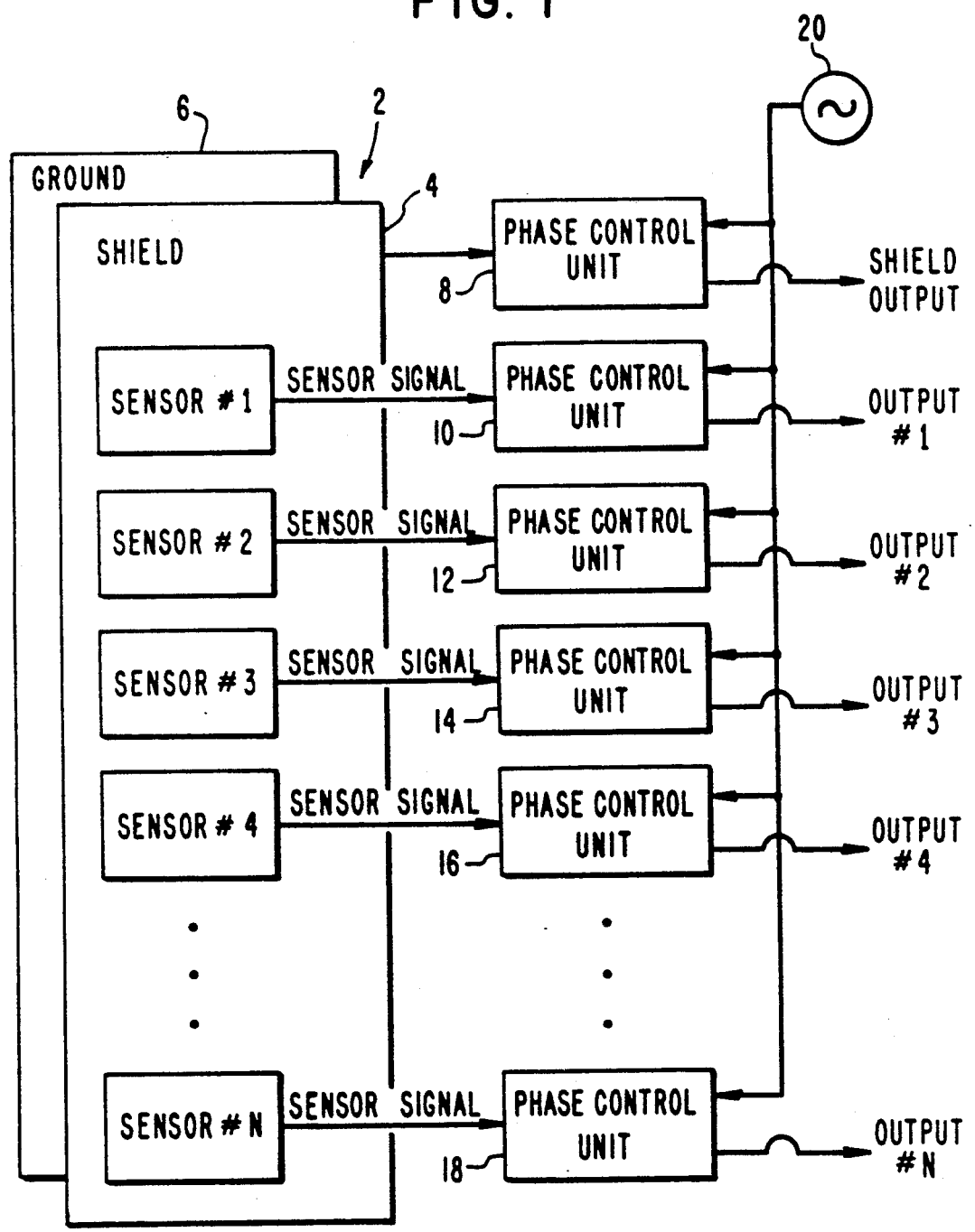
FIG. 1 is an overall block diagram of the phase discriminating capacitive sensor array system of the present invention.

FIG. 1 shows an overall block diagram of the phase discriminating capacitive sensor array system of the present invention. A capacitive sensor array 2 is comprised of a common shield 4 on which sensor elements 1-N are provided, and a common ground 6. The shield 4 and sensor elements 1-N each output a sensor signal to N phase control units 8, 10, 12, 14 and 16-18, respectively. Each phase control unit 8, 10, 12, 14 and 16-18 maintains the phase and amplitude of the sensor signal from each of the sensor elements 1-N, in accordance with a frequency reference provided by a crystal controlled oscillator 20. The crystal controlled oscillator 20 is frequency stabilized to a common frequency shared by the shield 4, ground 6 and sensor elements 1-N. The phase control units 8, 10, 12, 14 and 16-18 each produce an output signal (denoted shield output, and outputs 1-N). These output signals represent the voltage required to keep the sensor signals provided by the corresponding sensor elements 1-N at the same frequency, phase and amplitude.

Figure 2:
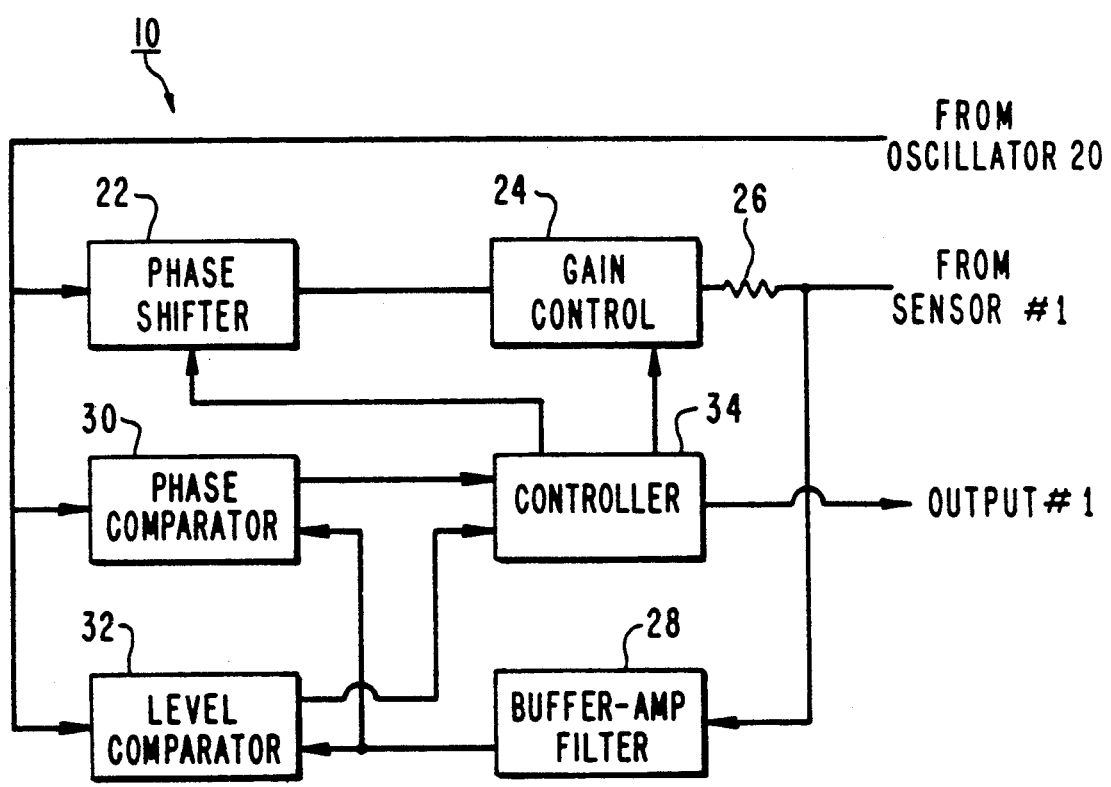
FIG. 2 is a block circuit diagram of a phase control unit shown in FIG. 1.

FIG. 2 is a block circuit diagram of any one of the phase control units 8, 10, 12, 14, and 16-18. For example, the phase control unit 10, which controls the sensor signal from sensor element 1, and produces output 1, is shown. The frequency reference from the oscillator 20 is passed through a conventional phase shifter 22 and then through a conventional gain control 24. The output of the gain control 24 drives a conventional resistor 26. The resistor 26 is connected to the sensor element 1 and the input of a conventional buffer amplifier filter 28.

The buffer amplifier filter 28 includes a narrow band bandpass filter at the frequency reference in order to remove a significant amount of the ambient noise. Since the frequency is fixed, the bandwidth is only as wide as the motion of the object sensed by sensor 1, for example, 2 hertz. The narrow band bandpass filter would be well-known to one of ordinary skill in the art. The narrow band filtering is possible because the sensor element simply appears as part of an impedance in a transmission line. This filtering occurs upon input of the sensor signal to the phase control unit.

The output of the buffer amplifier filter 28 drives a conventional phase comparator 30 and level comparator 32. The outputs from the phase comparator 30 and level comparator 32 are input to a controller 34. The controller drives the phase shifter 22 and gain control 24 to maintain the sensor signal from sensor 1 to be identical to the frequency reference from the oscillator 20.

When the sensor element 1 senses an object, the change in capacitance of the sensor element 1 changes the amount of adjustment required to be made by the controller 34 to the sensor signal. This change in the required amount of adjustment is reflected by a corresponding change in voltage in the output signal (output 1) from the controller 34. Thus, the change in voltage in output 1 indicates the proximity of the object sensed by sensor 1. Also, the rate of change in this voltage, which reflects the rate of change in the required amount of adjustment, thus indicates the closing speed of the object.

Figure 3:
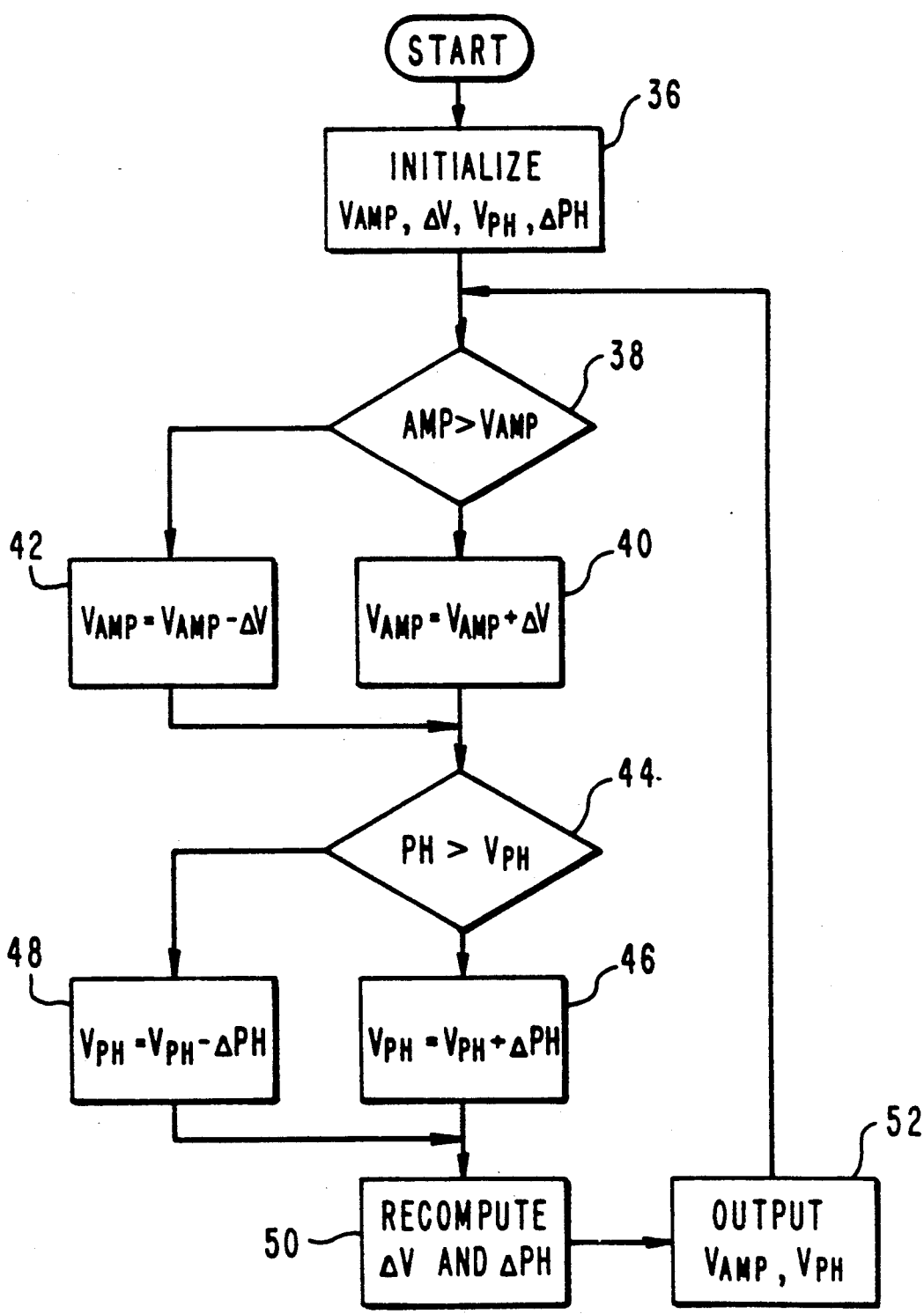
FIG. 3 is a flowchart of the control performed by the controller shown in FIG. 2.

FIG. 3 is the flowchart of the control performed by the controller 34. First, in step 36, the controller voltage $V_{AMP}$ (used to set the initial voltage at the sensor element) and the controller voltage $V_{PH}$ (used to set the initial phase at the sensor element) are initialized. Also, the change in voltage $\Delta V$, and the change in phase-induced voltage $\Delta PH$, which are expected to result when the sensor element encounters the object, are initialized based on an initial estimate for these values as expected. Next, in step 38, the amplitude AMP of the sensor signal is compared to the controller voltage $V_{AMP}$ which indicates the initial sensor voltage. If AMP exceeds $V_{AMP}$, then the controller voltage $V_{AMP}$ is adjusted in step 40 by adding the change in voltage $\Delta V$ of the sensor signal caused by the capacitance change in the sensor element when the sensor element senses an object. If, however, AMP does not exceed $V_{AMP}$, then $V_{AMP}$ is adjusted in step 42 by subtracting the change in voltage $\Delta V$.

In step 44, the phase PH of the sensor signal is compared to controller voltage $V_{PH}$ (which indicate the initial sensor phase). If PH exceeds $V_{PH}$ then the controller voltage $V_{PH}$ is adjusted in step 46 by adding the phase induced voltage change $\Delta PH$. If, however, PH does not exceed $V_{PH}$, then $V_{PH}$ is adjusted in step 48 by subtracting $\Delta PH$.

In step 50, $\Delta V$ and $\Delta PH$ are then recomputed based on a software search which implements in iteration to converge these values to within a specified range. Ideally, the specified range takes into account the distance and speed of the object. In step 52, the controller voltages $V_{AMP}$ and $V_{PH}$ are output as the output signal indicating the proximity and closing speed of the object. Control then returns to step 38, and the above described steps 38-52 are continually repeated as appropriate.

As a result of maintaining the sensor signals to be identical to the frequency reference provided by the oscillator 20, the sensor elements 1-N can be placed as closely together as desired, so that cross talk between the sensor elements is eliminated. The proximity and closing speed are measured by the adjustment made to the sensor signals for each sensor element, instead of by measuring an effect on a free running oscillator for each sensor element, as in the conventional capacitive sensor array system described above in the Background of the Invention. Thus, multiple free-running oscillators do not need to be provided corresponding to the multiple sensors, and cross-talk is therefore not a problem.

Another advantage of maintaining the sensor signals to be identical to the frequency reference is that the sensor elements can be placed as closely to the shields as desired in a "capaciflector" system, as described above. Thus, the sensor elements 1-N can be provided on the single shield 4 as shown in FIG. 2.

Also, because a narrow band bandpass filter is provided at the frequency reference in the buffer amplifier filter 28, noise is greatly reduced and the signal to noise ratio is improved, thus improving the sensor range and sensitivity.

Additionally, the output signals which provide the voltage indicative of the proximity and closing speed of the object can be provided to a robot controller which interprets and acts on the proximity and speed information accordingly. Also, as a result of maintaining the sensor signals to be identical to the frequency reference so that the sensor elements 1-N can be placed closely together, a pixelized image of the object can be produced using the output signals (shield output and outputs 1-N). Also, the edges of the object can be detected based on a sudden decrease in the voltages indicated by the output signals, which indicates a fall off of the amount of adjustment applied to the sensor signals for the sensor elements sensing the object at the edge.

It should be noted that the output signals providing the voltages indicative of the proximity, closing speed and edges of an object, can be utilized in a number of applications including but not limited to the robotics sensing and pixelized imaging described above.

Numerous modifications and adaptations of the present invention will be apparent to those so skilled in the art and thus, it is intended by the following claims to cover all modifications and adaptations which fall within the true spirit and scope of the invention.

What is claimed is:

1. A phase discriminating capacitive sensor array system for detecting an object, comprising:
   (a) a capacitive sensor array having sensor elements to sense the object, each sensor element producing a sensor signal;
   (b) a frequency stabilized oscillator providing a frequency reference; and
   (c) phase control means for controlling a phase and amplitude of each sensor signal, and adjusting each sensor signal to correspond to the frequency reference provided by said frequency stabilized oscillator.

2. A phase discriminating capacitive sensor array system according to claim 1, wherein
   said phase control means produces an output signal indicating a proximity of the object based on the adjustment made to each said sensor signal by said phase control means.

3. A phase discriminating capacitive sensor array system according to claim 1, wherein
   said phase control means produces an output signal indicating an edge of the object based on a sudden decrease in the adjustment made to the sensor signal.

4. A phase discriminating capacitive sensor array system according to claim 1, wherein said capacitive sensor array comprises a shield on which said sensor elements are provided.

5. A phase discriminating capacitive sensor array system for detecting an object, comprising:
   (a) a capacitive sensor array having sensor elements to sense the object, each sensor element producing a sensor signal;
   (b) a frequency stabilized oscillator providing a frequency reference; and
   (c) a phase control means for controlling a phase and amplitude of each sensor signal, and adjusting each sensor signal to correspond to the frequency reference provided by said frequency stabilized oscillator;
   said phase control means producing an output signal indicating a closing speed of the object based on a rate of change of the adjustment made to the sensor signal.

6. A method of detecting an object, comprising the steps of:
   (a) sensing the object with multiple sensor elements and producing a sensor signal for each of the sensor elements;
   (b) providing a common frequency reference for each of the sensor elements; and
   (c) adjusting the phase and amplitude of the sensor signal from each of the sensor elements to correspond to the common frequency reference.

7. A method according to claim 6, further comprising the step of
   (d) producing an output signal indicating a proximity of the object based on the adjustment made to each said sensor signal.

8. A method according to claim 6, further comprising the step of:
   (d) producing an output signal indicating an edge of the object based on a sudden decrease in the adjustment made to the sensor signal.

9. A method according to claim 6, wherein step (c) comprises
   adjusting a voltage indicating initial sensor voltage by a voltage change induced by an amplitude change caused by sensing the object, and adjusting a voltage indicating initial sensor voltage by a voltage change induced by a phase change caused by sensing the object.

10. A method according to claim 9, wherein step (d) comprises
    producing an output signal indicating a proximity of the object based on the adjustment made to each said sensor signal based on the adjusted voltage.

11. A method according to claim 9, wherein step (d) comprises
    producing an output signal indicating a closing speed of the object based on a rate of change of the adjustment made to the sensor signal.

12. A method according to claim 9, wherein step (d) comprises
    producing an output signal indicating an edge of the object based on a sudden decrease in the adjustment made to the sensor signal based on the adjusted voltage.

13. A method of detecting an object, comprising the steps of:
    (a) sensing the object with multiple sensor elements and producing a sensor signal for each of the sensor elements;
    (b) providing a common frequency reference for each of the sensor elements;
    (c) adjusting the phase and amplitude of the sensor signal from each of the sensor elements to correspond to the common frequency reference; and
    (d) producing an output signal indicating a closing speed of the object based on a rate of change of the adjustment made to the sensor signal.

* * * * *